United States Patent [19]
Kwok et al.

[11] Patent Number: 6,033,975
[45] Date of Patent: Mar. 7, 2000

[54] IMPLANT SCREEN AND METHOD

[75] Inventors: Siang Ping Kwok, Dallas; William F. Richardson, Richardson; Dirk Noel Anderson, Plano, all of Tex.; Jiann Liu, Singapore, Singapore

[73] Assignee: Texas Instruments Incorporated, Dallas, Tex.

[21] Appl. No.: 08/992,392

[22] Filed: Dec. 17, 1997

Related U.S. Application Data

[60] Provisional application No. 60/034,171, Jan. 2, 1997.

[51] Int. Cl.[7] .................... H01L 21/3205; H01L 21/4763
[52] U.S. Cl. .......................... 438/585; 438/586; 438/597; 438/626
[58] Field of Search .................................... 438/585, 586, 438/523, 531, 672, 597, 626

[56] References Cited

U.S. PATENT DOCUMENTS

| | | |
|---|---|---|
| 5,045,486 | 9/1991 | Chittipeddi et al. . |
| 5,420,079 | 5/1995 | Onishi et al. . |
| 5,482,876 | 1/1996 | Hsieh et al. . |
| 5,607,879 | 3/1997 | Wuu et al. . |
| 5,610,099 | 3/1997 | Stevens et al. . |

OTHER PUBLICATIONS

Local Oxidation of Silicon and its Application in Semiconductor–Device Technology*), by J.A. Appels, E. Kooi, M.M. Paffen, J.J.H. Schatorje and W.H.C.G. Verkuylen, Philips Res. Repts 25, (1970), pp. 118–132, *) This paper corresponds to a paper presented by the authors at the 3rd conference on Solid State Devices, Exeter (England), Sep. 1969.

"VLSI Technology", S.M. Sze, pp. 466, McGraw–Hill Book Co. (1983).

*Primary Examiner*—John F. Niebling
*Assistant Examiner*—Jonathan Hack
*Attorney, Agent, or Firm*—Jacqueline J. Garner; Wade James Brady, III; Richard L. Donaldson

[57] ABSTRACT

A semiconductor device (60) may comprise a semiconductor layer (12) having an outer surface (20). A plurality of gates (18) may be disposed over the outer surface (20) of the semiconductor layer (12). An isolation cover (30) may be disposed over the gates (18). An implant screen (40) may be grown on the outer surface (20) of the semiconductor layer (12) between the isolation covers (30) of the gates (18).

16 Claims, 2 Drawing Sheets

IMPLANT SCREEN AND METHOD

This application claims priority under 35 USC § 119 (e)(1) of provisional application number 60/034,171, filed Jan. 2, 1997.

TECHNICAL FIELD OF THE INVENTION

This invention relates generally to the field of electronic devices, and more particularly to an improved implant screen and method.

BACKGROUND OF THE INVENTION

Implant screens are well known in the art of semiconductor fabrication. Implant screens are used to control the depth of an implant, and thus a resulting junction depth. The implant screen may also act as a protective etch stop in the formation of self-aligned contacts.

Typically, an implant screen comprises a thin oxide deposited over a semiconductor structure. The deposited screen oxide generally reduces space between components of the semiconductor structure. This reduction is problematic in high density circuits with tightly packed transistors and other components.

SUMMARY OF THE INVENTION

Accordingly, a need has arisen in the art for an improved implant screen. The present invention provides an implant screen that substantially reduces or eliminates problems associated with prior implant screens.

In accordance with the present invention, a semiconductor device may comprise a semiconductor layer having an outer surface. A plurality of gates may be disposed over the outer surface on the semiconductor layer. An isolation cover may be disposed over the gates. An implant screen may be grown on the outer surface of the semiconductor layer between the isolation covers of the gates.

More specifically, in accordance with one embodiment of the present invention, the semiconductor device may be a high density device with gates formed within 0.25 microns of one another. The isolation cover may comprise silicon nitride. The implant screen may comprise silicon dioxide and have a thickness of about 200 angstroms.

Technical advantages of the present invention include providing an improved implant screen and method. In particular, the implant screen may be grown by oxidizing exposed portions of the outer surface of the semiconductor layer between the isolation covers of the gate. Thus, additional sidewalls are not formed on the protective covers of the gates by the implant screen. Accordingly, space between gates for contacts to the implants is not reduced.

Another technical advantage of the present invention includes providing improved contacts. In particular, increased space is provided between the isolation covers of the gates. The increase in space substantially reduces or eliminates void formation in a planarizing layer in which contacts to the implants are formed. Accordingly, contact deformities caused by such voids are substantially reduced or eliminated.

Other technical advantages of the present invention will be readily apparent to one skilled in the art from the following figures, description and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to FIGS. 1A–E of the drawings, and which like numerals refer to like parts throughout the several views. FIGS. 1A–E illustrate method of fabricating an implant screen in accordance with one embodiment of the present invention. The implant screen is shown in connection with fabrication of an exemplary dynamic random access memory (DRAM) device. It will be understood that the implant screen of the present invention may be used to fabricate other types of semiconductor devices.

Figure 1A:
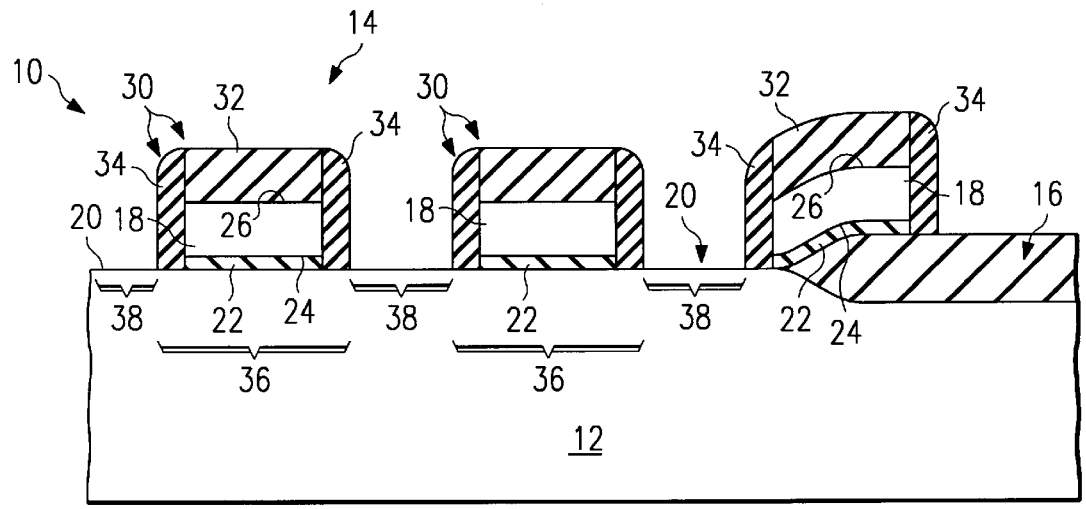
FIGS. 1A–E are a series of schematic cross-sectional diagrams illustrating a method of fabricating an implant screen in accordance with one embodiment of the present invention.

FIG. 1A illustrates an initial semiconductor structure 10 for fabricating the exemplary dynamic random access memory device. The initial semiconductor structure 10 may have a semiconductor layer 12 having a component region 14 bounded by a field oxide region 16. The semiconductor layer 12 may be a substrate such as a wafer. It will be understood that the semiconductor layer 12 may also be a layer of semiconductor material formed on the substrate. For example, the semiconductor layer 12 may be an epitaxial layer grown on a wafer.

The semiconductor layer 12 may be of a first conductive type. In one embodiment, the first connective type may be p-type material. In this embodiment, the semiconductor layer 12 may comprise a single-crystalline silicon material that has been slightly doped with a p-type dopant such as boron. It will be understood that the semiconductor layer 12 may be doped with other dopants or be of another conductive type within the scope of the present invention.

As described in more detail below, DRAM cells may be fabricated in the component region 14 of the semiconductor layer 12. The component region 14 may be formed within the field oxide region 16 using conventional photolithography techniques associated with pattern and etching. The field oxide region 16 may be formed as a result of a local oxidation process, or shallow trench into silicon and filled with oxide. The field oxide region 16 may provide an area in which interconnection for the DRAM cells may be fabricated.

The component region 14 may include a plurality of gate bodies 18 for forming DRAM cells. The gate bodies 18 may each be separated from an outer surface 20 of the semiconductor layer 12 by a gate insulator 22. The gate body 18 may have an inner surface 24 adjacent to the gate insulator 22 and an opposite outer surface 26. The gate body 18 may comprise polycrystalline silicon or other suitable conducting material. The gate insulator 22 may comprise silicon dioxide or other suitable insulator material.

As shown by FIG. 1A, the gate bodies 18 and gate insulators 22 may be formed in the component region 14 and extend onto an edge of the field oxide region 16. In one embodiment, the gate bodies 18 may be formed within 0.25 microns of one another. This spacing allows a high density of dynamic random access memory cells within the component region 14.

An isolation cover 30 may be formed over each of the gate bodies 18. The isolation cover 30 electrically isolates the gate body 18 from other elements of the dynamic random access memory cell. The isolation cover 30 may include a top 32 covering the outer surface 26 of the gate bodies 18 and sidewalls 34 extending to the semiconductor layer 12 to cover the remaining portion of the gate bodies 18.

The isolation cover 30 may comprise a dielectric material such as silicon nitride. It will be understood that the isolation cover 30 may comprise other dielectric materials or combination of dielectric materials within the scope of the present invention. For example, the isolation cover may comprise silicon dioxide.

The isolation cover 30 may be conventionally formed by depositing a layer of insulation material over the gate bodies 18 and anisotropically etching the layer. The anisotropic etch may be a conventional reactive ion etch (RIE) using carbon fluorine-base gases such as $CF_4$ and/or $CHF_3$.

Gate bodies 18 and associated isolation covers 30 may cover a gate region 36 of the semiconductor layer 12. As shown by FIG. 1A, the gate region 36 and field oxide region 16 may form a non-implant region that covers the upper surface 20 of the semiconductor layer 12 except for spaces in between the isolation covers 30 of the gate bodies 18. These spaces may make up an implant region 38 of the semiconductor layer 12. As described in more detail below, dopants may be implanted into the implant region 38 to form source and drain regions of the gate bodies 18.

Figure 1B:
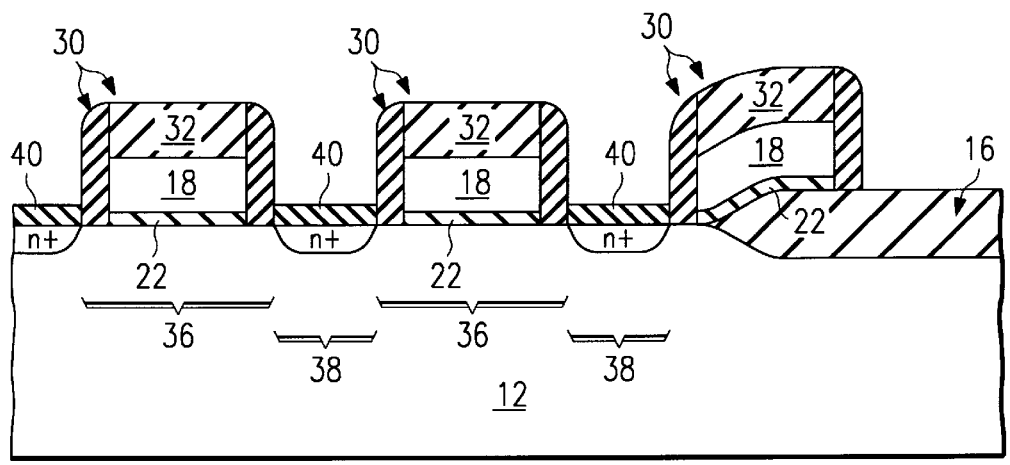

Referring to FIG. 1B, an implant screen 40 may be formed on the outer surface 20 of the semiconductor layer 12 to control the depth of source and drain implants. In accordance with the present invention, the implant screen 40 may be formed by oxidizing the outer surface 20 of the semiconductor layer 12 in the implant region 38. The outer surface 20 of the semiconductor layer 12 may be oxidized by thermal treatment of the semiconductor device. For an embodiment in which the semiconductor layer 12 comprises silicon, the implant screen 40 may comprise silicon dioxide.

Thermal treatment may conventionally comprise treatment in a furnace at about 800° C. for ten (10) to twenty (20) minutes at atmospheric temperature and less time at high pressure. Chemically enhanced oxidation such as fluorinated oxidation may also be used to reduce the thermal cycle. In this embodiment, the implant screen 40 may have a thickness of about 200 angstroms. It will be understood that temperature and duration of the thermal treatment and the thickness of the implant screen 40 may vary with the specific design of a semiconductor device. Accordingly, the implant screen 40 may have a thickness greater or less than 200 angstroms and the semiconductor device may be thermally treated to achieve the desired thickness.

During thermal treatment, the outer surface 20 of the semiconductor layer 12 in the implant region 38 will be oxidized to grow the implant screen 40. Because the outer surface 20 of the semiconductor layer 12 is only exposed in the implant region 38, the implant screen 40 will only grow in that region. As previously described, the remaining portion of the outer surface 20 of the semiconductor layer 12 is protected by the isolation covers 30 of the gate bodies 18 and the thick field oxide of the field oxide region 16. As a result, formation of the implant screen 40 does not add to the thickness of the isolation covers 30 to limit the area between the isolation covers 30. As described in more detail below, this area may be used to form contacts for the source and drain regions of the gate bodies 14. The increased area between the isolation covers 30 substantially reduces or eliminates narrowing in contacts formed in those areas.

Dopants may be conventionally implanted into the implant region 38 through the implant screen 40 to form source and drain regions of the gate bodies 18. The implant screen 40 will control the depth of the implants into the semiconductor layer 12 to control the depth of the source and drain regions. The source and drain regions may be of a second conductive type. For the embodiment in which the first conductive type is p-type material, the second conductive type may be n-type material. In this embodiment, the implant region 38 may be implanted with an n-type dopant such as Arsenic. It will be understood that the implant region 38 may be doped with other dopants or may be of another conductive type within the scope of the present invention.

Figure 1C:
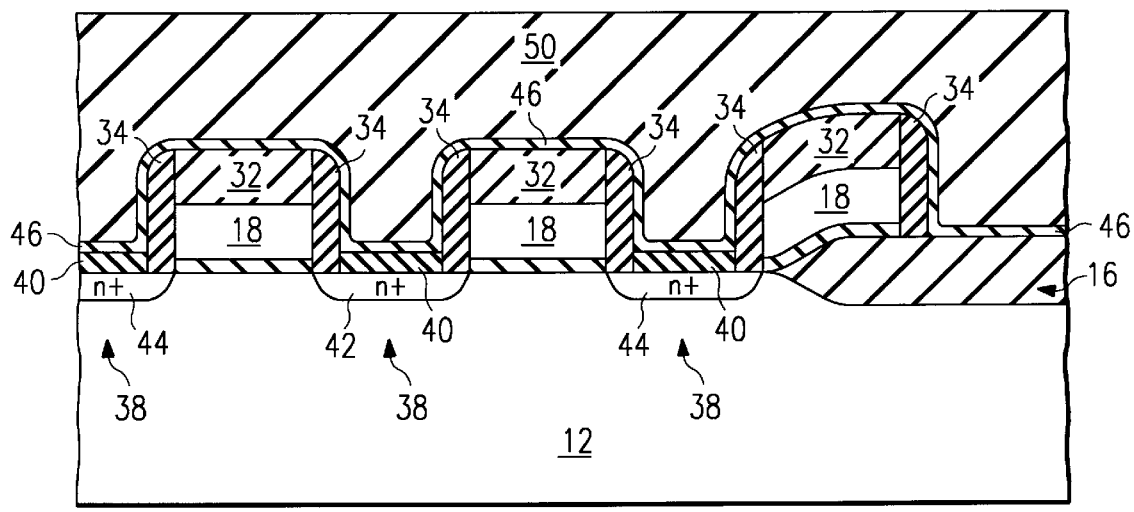

Referring to FIG. 1C, the dopants implanted into the semiconductor layer 12 may be activated and/or diffused to form the source regions 42 and drain regions 44 of the gate bodies 18. The dopants may be activated by conventionally annealing the semiconductor layer 12. The temperature and duration of the anneal may vary according to the specific design of the semiconductor device. Such thermal treatment to activate dopants is well known in the art and will not be further described herein.

After the dopants have been diffused, an etch stop 46 may be formed on the semiconductor device. The etch stop 46 may protect the isolation cover 30 and the implant region of the semiconductor layer 12 from later semiconductor processing. In one embodiment, the etch stop 46 may comprise silicon nitride. In this embodiment, the etch stop 46 may be about 100 angstroms thick. It will be understood that the thickness and materials of the etch stop 46 may vary within the scope of the present invention.

A planarizing layer 50 may be conventionally deposited over the semiconductor device. In accordance with the present invention, the planarizing layer 50 may be deposited without forming voids between the isolation covers 30 because of the increased area afforded by the improved implant screen 40. In one embodiment, the planarizing layer 50 may comprise boron phosphate silicate glass (BPSG) and have a thickness of 4,000 angstroms. It will be understood that the planarizing layer 50 may have a different thickness and may comprise other materials within the scope of the present invention.

Figure 1D:
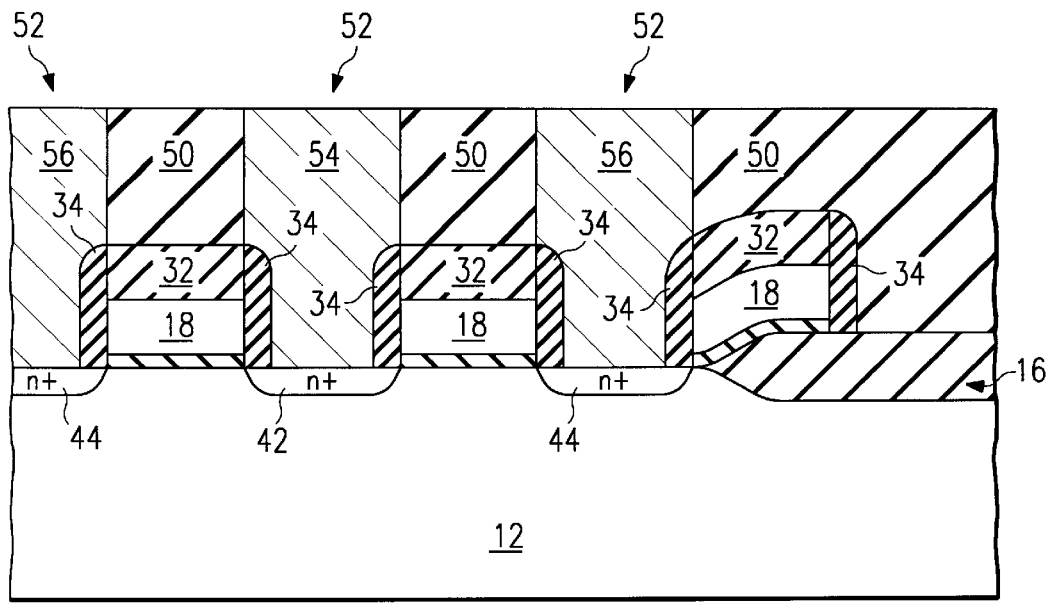

Referring to FIG. 1D, the planarizing layer 50 may be conventionally patterned and etched to form vias 52 over the source regions 42 and the drain regions 44 of the gate bodies 18. The via etch may be a conventional anisotropic etch. The isolation cover 30 may also serve as etch protection of the gate 18. This allows self-aligned vias to be etched for increased circuit density. During the etch, the etch stop 46 may protect the source and drain regions 42 and 44 of the gate bodies 18. Thereafter, the etch stop 46 may be removed using an appropriate etch. During removal of the etch stop 46, the implant screen 40 protects the source and drain regions 42 and 44 in the semiconductor layer 12. After the etch stop 46 has been removed, a conventional wet etch may then be used to remove the implant screen 40 above the source and drain regions 42 and 44 of the gate bodies 18. Accordingly, contacts may be formed directly to the source and drain regions 42 and 44.

A source contact 54 may be formed with conventional process in the via 52 over the source region 42. Similarly, drain contacts 56 may be formed with conventional process in the via 52 over the drain region 44. In accordance with the present invention, the contacts 54 and 56 may be formed without contact area reduction and without bridging short between neighboring calls. The bridging short is caused by voids in the planarization layer 50. As previously described, the increased area between the isolation covers 30 substantially reduces or eliminates narrowing of contact area and void formation in the planarizing layer 50. In one embodiment, the contacts 54 and 56 may comprise doped polysilicon. It will be understood that the contacts 54 and 56 may comprise other materials within the scope of the present invention.

Figure 1E:
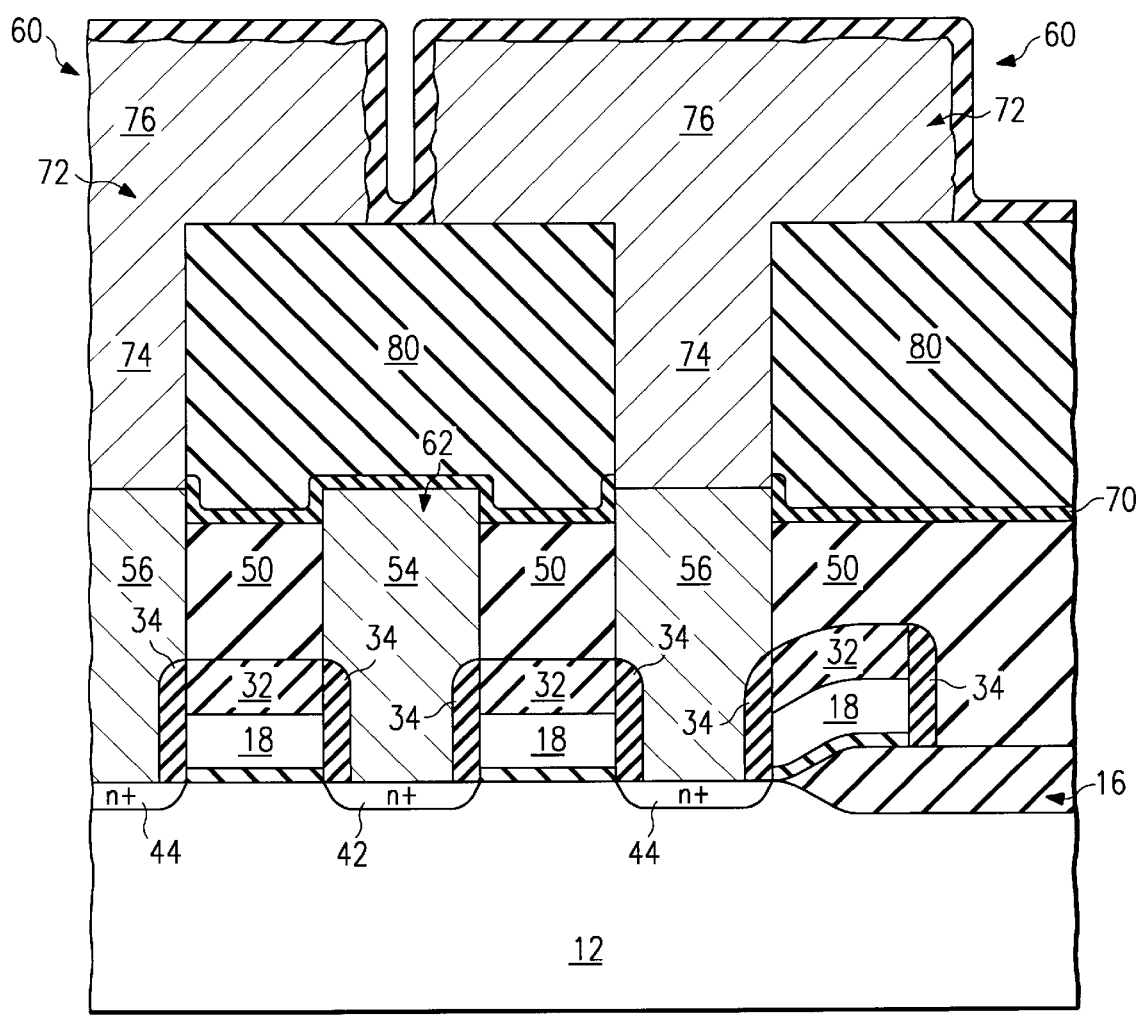

FIG. 1E illustrates conventional DRAM cells 60 constructed from the gates 18 and contacts 54 and 56. Referring to FIG. 1E, a bit line 62 of the DRAM cells 60 may be electrically coupled to source region 42 and insulatively adjacent to gates 18. The gates 18 are typically control gates associated with access transistors that couple a storage electrode to the bit line 62.

A nitride layer 70 may overlay the source region 42, drain regions 44, gates 18 and bit line 62. Extending through the nitride layer 70 to the contacts 56 of the drain region 44 is a storage electrode 72. The storage electrode 72 may include a stem portion 74 and a cap portion 76. The cap portion 76 may provide an increase in surface area of the electrode 72. The storage electrode 72 may be formed of doped silicon. It will be understood that the storage electrode 72 may comprise another geometry or be formed of other materials within the scope of the present invention.

The storage electrodes 72 may be separated by insulators 80. The insulators 80 may comprise boron phosphate silicate glass (BPSG). It will be understood that the insulators 80 may be formed of other materials within the scope of the present invention.

The present invention has been described in connection with exemplary DRAM cells. As previously discussed, it will be understood that the improved implant screen of the present invention may be used to form a wide variety of memory cells and other types of electronic devices.

Although the present invention has been described with several embodiments, various changes and modifications may be suggested to one skilled in the art. It is intended that the present invention encompass such changes and modifications as fall within the scope of the appended claims.

What is claimed is:

1. A method of forming an integrated circuit, comprising the steps of:
   forming a semiconductor layer having an outer surface;
   forming a plurality of gates over the outer surface of the semiconductor layer;
   forming an isolation cover over the gates; and
   oxidizing the outer surface of the semiconductor layer to grow an implant screen on the outer surface of the semiconductor layer between the isolation covers of the gates and not over the isolation cover over the gates.

2. The method of claim 1 further comprising the steps of:
   forming a planarizing layer over the implant screens and the isolation covers;
   forming vias in the planarizing layer over the implant screens;
   removing the implant screens; and
   forming contacts to the semiconductor layer in the vias.

3. A method of forming an implant screen, comprising the steps of:
   covering a non implant region of a semiconductor layer with a protective cover, said non implant region comprising a gate region; and
   oxidizing an outer surface of the semiconductor layer in an implant region of the semiconductor layer to grow an implant screen over the outer surface of the semiconductor layer but not over the protective cover.

4. The method of claim 1, wherein the gates are formed within 0.25 microns of one another.

5. The method of claim 1, wherein the isolation cover comprises silicon nitride.

6. The method of claim 1, wherein the implant screen comprises silicon dioxide.

7. The method of claim 1, wherein the implant screen has a thickness of about 200 angstroms.

8. The method of claim 2, wherein the planarizing layer comprises boron phosphate silicate glass (BPSG).

9. The method of claim 1, wherein the implant screen provides an etch stop for self-aligned contact formation.

10. A method of forming an implant screen, comprising the steps of:
    covering a non implant region of a semiconductor layer with a protective cover; and
    oxidizing an outer surface of the semiconductor layer in an implant region and not in said non implant region of the semiconductor layer to grow an implant screen.

11. The method of claim 10, further comprising the step of thermally treating the semiconductor layer to oxidize the outer surface of the semiconductor layer.

12. The method of claim 10, wherein the implant screen comprises silicon dioxide.

13. The method of claim 10, wherein the implant screen is grown to a thickness of about 200 angstroms.

14. The method of claim 10, wherein the non implant region further comprises a field oxide region of the semiconductor layer.

15. The method of claim 10, wherein the protective cover comprises silicon nitride.

16. A method of forming an integrated circuit, comprising the steps of:
    forming a semiconductor layer having an outer surface;
    forming a plurality of gates over the outer surface of the semiconductor layer;
    forming an isolation cover over the gates; and
    oxidizing the outer surface of the semiconductor layer to grow an implant screen on the outer surface of the semiconductor layer between the isolation covers of the gates and not over the isolation cover over the gates, wherein the implant screen provides an etch stop for self-aligned contact formation.

* * * * *